US009563584B2

(12) United States Patent
Zhang (10) Patent No.: US 9,563,584 B2
(45) Date of Patent: Feb. 7, 2017

(54) METHOD AND DEVICE FOR BUFFER PROCESSING IN SYSTEM ON CHIP (71) Applicants: ZTE Corporation, Shenzhen, Guangdong (CN); ZTE Microelectronics Technology Co., Ltd, Shenzhen (CN)

(72) Inventor: Linsheng Zhang, Shenzhen (CN)

(73) Assignees: ZTE MICROELECTRONICS TECHNOLOGY CO., LTD., Shenzhen, Guangdong (CN); ZTE CORPORATION, Shenzhen, Guangdong (CN)

( * ) Notice: Subject to any disclaimer, the term of this patent is extended or adjusted under 35 U.S.C. 154(b) by 0 days.

(21) Appl. No.: 14/442,066

(22) PCT Filed: Aug. 22, 2013

(86) PCT No.: PCT/CN2013/082050
§ 371 (c)(1),
(2) Date: May 11, 2015

(87) PCT Pub. No.: WO2013/189413
PCT Pub. Date: Dec. 27, 2013

(65) Prior Publication Data
US 2015/0317264 A1 Nov. 5, 2015

(30) Foreign Application Priority Data

Nov. 22, 2012 (CN) .......................... 2012 1 0478383

(51) Int. Cl.
G06F 3/00 (2006.01)
G06F 13/16 (2006.01)
(Continued)

(52) U.S. Cl.
CPC ........... *G06F 13/1673* (2013.01); *G06F 9/468* (2013.01); *G06F 9/50* (2013.01); *G06F 12/023* (2013.01);
(Continued)

(58) Field of Classification Search
CPC ........ G06F 13/1673; G06F 9/50; G06F 9/468; G06F 12/08; G06F 12/023; G06F 2212/1044; G11C 8/06
See application file for complete search history.

(56) References Cited

U.S. PATENT DOCUMENTS 5,610,809 A * 3/1997 Morita ................. G06F 12/023
700/23
5,652,883 A * 7/1997 Adcock ............... G06F 12/0253
(Continued)

FOREIGN PATENT DOCUMENTS

CN 1677946 A 10/2005
CN 1725728 A 1/2006
(Continued)

OTHER PUBLICATIONS

Supplementary European Search Report in European application number: 13806128.8, mailed on Oct. 12, 2015.
(Continued)

*Primary Examiner* — Jing-Yih Shyu
(74) *Attorney, Agent, or Firm* — Oppedahl Patent Law Firm LLC (57) ABSTRACT Provided are a method and device for buffer processing in a System on Chip (SoC). The method includes that when a first datum of a first user needs to be buffered, a current storage start address is read, the first datum is stored into a buffer space from the current storage start address, wherein the buffer space occupied by the first datum is a first buffer space; corresponding to the first datum, storage location information including a start address and a space length of the first buffer space is saved, so that when the first datum needs to be read, the first buffer space is located according
(Continued)

to the start address and the space length, and the first datum is read from the first buffer space; the current storage start address is updated with a next address of the first buffer space, so that next data needing to be buffered is buffered from the updated current storage start address.

10 Claims, 3 Drawing Sheets (51) Int. Cl.
G11C 8/06 (2006.01)
G06F 12/02 (2006.01)
G06F 12/08 (2016.01)
G06F 9/46 (2006.01)
G06F 9/50 (2006.01)

(52) U.S. Cl.
CPC ............... *G06F 12/08* (2013.01); *G11C 8/06* (2013.01); *G06F 2212/1044* (2013.01)

(56) References Cited

U.S. PATENT DOCUMENTS 7,650,370 B2 * 1/2010 Dahlstedt .......... G06F 12/0253
707/999.206

| 2003/0131012 | A1 | 7/2003 | Dahlstedt |
| 2003/0196044 | A1 | 10/2003 | Ramirez |
| 2005/0256913 | A1 | 11/2005 | Dahlstedt |
| 2006/0036829 | A1* | 2/2006 | Wang ................ G06F 12/04 711/170 |

FOREIGN PATENT DOCUMENTS

| CN | 101122886 A | 2/2008 |
| CN | 101196857 A | 6/2008 |
| CN | 102197381 A | 9/2011 |
| CN | 102646084 A | 8/2012 |
| EP | 0294499 A1 | 12/1988 |
| JP | 2006161864 | 6/2006 |
| JP | 2008241186 A | 10/2008 |

OTHER PUBLICATIONS

International Search Report in international application No. PCT/CN2013/082050, mailed on Nov. 28, 2013.

English Translation of the Written Opinion of the International Search Authority in international application No. PCT/CN2013/082050, mailed on Nov. 28, 2013.

* cited by examiner

METHOD AND DEVICE FOR BUFFER PROCESSING IN SYSTEM ON CHIP

TECHNICAL FIELD

The disclosure relates to the field of network storage, and in particular to a method and device for buffer processing in a System on Chip SOC).

BACKGROUND

A SoC technology integrates a Central Processing Unit/Micro Process Unit (CPU/PU), a Digital Signal Processor (DSP), a hardware accelerator, a memory, a peripheral interface and other subsystems into a chip through bus interconnection. Besides a local private storage/buffer needed for internal data processing, these subsystems often need to share a centralized storage/buffer for a variety of reasons, for example, data interaction buffering is required among these subsystems; for another example, these subsystems share a memory for processing multi-user services.

These centralized buffers shared by multiple sources/multiple users can be one or several storage units physically, such as a Static Random-Access Memory (SRAM), or a Dynamic Random-Access Memory (DRAM), or several combinations of them, but they can be regarded as a shared buffer logically. The shared buffer described below is discussed on a basis that it is logically a storage unit, but actually it physically can be a storage unit or a combination of several storage units.

Like any public resource, sharing a buffer by multiple sources/multiple users needs to consider allocation and management of storage resources.

At present, a method of using a shared buffer in a SoC design is basically dividing the shared buffer into N fragments with the same size; the size of such a fragment is required to be capable of holding the minimum data needed by each source/each user; big data occupies M fragments, wherein M is an integer, and M is less than or equal to N.

This method is disadvantaged in needing a very large storage space to record a use state and storage location information of each fragment. Especially, when the length of the minimum data needed by a system is very short, the space for storage of each fragment is also very small; when big data is stored, many fragments are needed. In addition, this method wastes a shared buffer space, for example, some data are only a little bit bigger than an integral number of fragments, and need to be stored in another single fragment.

SUMMARY

A technical problem to he solved by the disclosure is to provide a method and device for buffer processing in a SoC which can realize better planning and management and economize a buffer space.

For solving the technical problem, an embodiment of the disclosure provides a method for buffer processing in a SoC, which includes that:

when a first datum of a first user needs to be buffered, a current storage start address is read;

the first datum is stored into a buffer space from the current storage start address, wherein the buffer space occupied by the first datum is a first buffer space;

for the first datum, storage location information including a start address and a space length of the first buffer space is saved, so as to locate the first buffer space according to the start address and the space length when the first datum needs to be read, and to read the first datum from the first buffer space; and the current storage start address is updated with a next address of the first buffer space, so as to buffer next data needed to be buffered from the updated current storage start address.

Preferably, after the first datum is stored into the buffer space from the current storage start address, the method further may include that:

an idle state of the first datum is recorded, and it is determined that whether the first datum is released according to the idle state.

Preferably, the method may further include that:

a threshold value is set, wherein the threshold value is a buffer space size needed for storing a maximum datum;

when a remaining buffer space behind the current storage start address is smaller than the threshold value, data in the buffer space is arranged by a predetermined method, and a start address of each datum is updated after the arrangement; wherein the predetermined method is selecting from the buffer space an invalid datum stored at the earliest, and consecutively storing, from a start address of the selected invalid datum, valid data behind the selected invalid datum until all the valid data consecutively occupy the buffer space; wherein the invalid datum is a released datum, and the valid data are data not released; and after the arrangement is completed, the current storage start address is updated with a next address of a last valid datum in the buffer space.

Preferably, the predetermined method may be that:

the invalid datum stored at the earliest is selected from the buffer space, a start address of the selected invalid datum in the buffer space is obtained through storage location information of the selected invalid datum, and the current storage start address is updated with the start address of the selected invalid datum;

a first valid datum behind the selected invalid datum is stored from the updated current storage start address, and storage location information of the first valid datum is updated; and the current storage start address is updated with a next address of the first valid datum in the buffer space, so as to buffer a next valid data behind the first valid datum from the updated current storage start address until each buffered valid datum is capable of consecutively occupying the buffer space.

Preferably, the method may further include that:

a valid datum which is being read or arranged is locked, to ensure the valid datum not to be read and arranged simultaneously in the locking process.

The disclosure also provides a device for buffer processing in a SoC, including a processor configured to be capable of executing programmed instructions comprising:

reading a current storage start address of a buffer space when a first datum of a first user needs to be buffered, wherein the buffer space is shared by sub-systems in the SOC;

storing the first datum to the buffer space from the current storage start address, wherein the buffer space occupied by the first datum is a first buffer space;

for the first datum, saving storage location information comprising a start address and a space length of the first buffer space, to locate the first buffer space according to the start address and the space length of the first buffer space when the first datum needs to be read and reading the first datum from the first buffer space; and updating the current storage start address with a next address of the first buffer space, to buffer next data needed to be buffered from the updated current storage start address, Preferably, after storing the first datum into the buffer space from the current storage start address, the processor configured to be capable of executing programmed instructions further comprising: recording an idle state of the first datum, and determine whether the first datum is released according to the idle state, Preferably, the processor configured to be capable of executing programmed instructions further comprising;

setting a threshold value, wherein the threshold value is a buffer space size needed for storing a maximum datum:

when a remaining buffer space behind the current storage start address is smaller than the threshold value, arranging data in the buffer space by a predefined method, and updating a start address of each datum after the arrangement; wherein the predefined method is selecting from the buffer space an invalid datum stored at the earliest, and consecutively storing, from a start address of the selected invalid datum, valid data behind the selected invalid datum until all the valid data consecutively occupy the buffer space; wherein the invalid datum is a released datum, and The valid data are data not released;

after the arrangement is completed, updating the current storage start address with a next address of a last valid datum in the buffer space.

Preferably, the processor configured to be capable of executing programmed instructions further comprising:

locking a valid datum which is being read or arranged to ensure the valid datum not to be read and arranged simultaneously in the locking process.

The above technical solution of the disclosure has the following beneficial effects:

compared with the prior art which divides a buffer space into a number of fragments, consecutively storing data in a buffer space can make better use of the buffer space; furthermore, in the prior art, it is needed to record buffer addresses of these fragments for reading data, so the amount of stored information is very large, while in the embodiments of the disclosure, data are consecutively stored into the buffer space, so data can be read as long as the start address of each datum in the buffer space and the space length are recorded, and the amount of stored information depends on the amount of packets.

DETAILED DESCRIPTION

For making the technical problem to be solved by the disclosure, the technical solutions and the advantages of the disclosure more clear, the disclosure is elaborated below with reference to the embodiments and the accompanying drawings.

Embodiment 1

Figure 1:
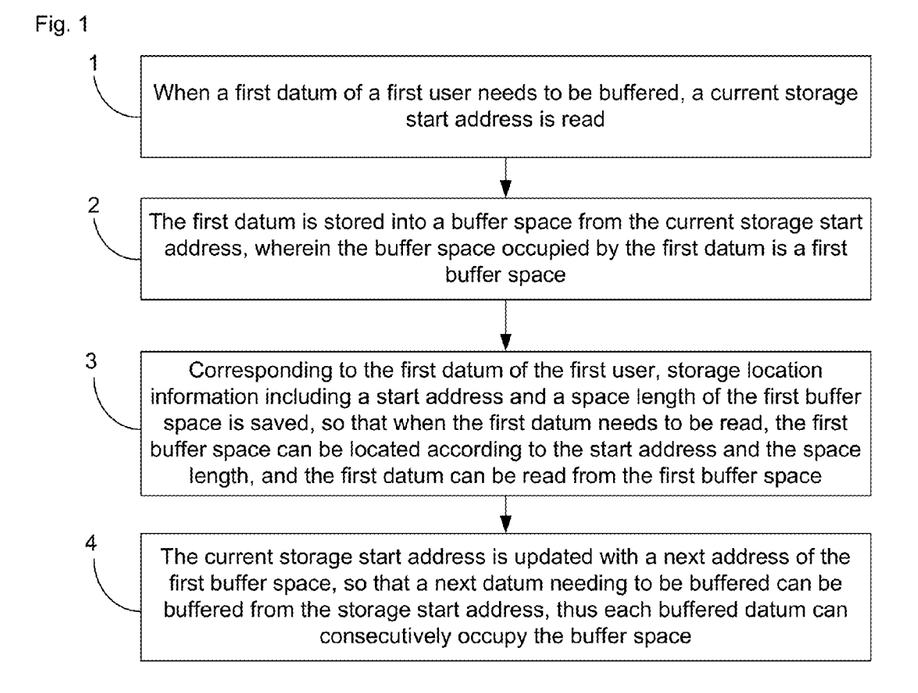
FIG. 1 is a diagram of a method for buffer processing according to embodiment 1 of the disclosure.

As shown FIG. 1, a method for buffer processing includes the following steps:

Step 1: when a first datum of a first user needs to be buffered, a current storage start address is read;

Step 2: the first datum is stored into a buffer space from the current storage start address, wherein the buffer space occupied by the first datum is a first buffer space;

Step 3: corresponding to the first datum of the first user, storage location information including a start address and a space length of the first buffer space is saved, so that when the first datum needs to be read, the first buffer space can be located according to the start address and the space length, and the first datum can be read from the first buffer space; and Step 4: the current storage start address is updated with a next address of the first buffer space, so that a next datum needing to be buffered can be buffered from the storage start address, thus each buffered datum can consecutively occupy the buffer space.

Compared with the prior art which divides a buffer space into a number of fragments, the method of the present embodiment consecutively stores data into a buffer space, which can make better use of the buffer space; furthermore, in the prior art, it is needed to record buffer addresses of these fragments for reading data, so the amount of stored information is very large, however, in the present embodiment data are consecutively stored into the buffer space, so data can be read as long as the start address of each datum in the buffer space and the space length are recorded, and the amount of stored information depends on the amount of packets.

The method shown in FIG. 1 is elaborated below.

Figure 2:
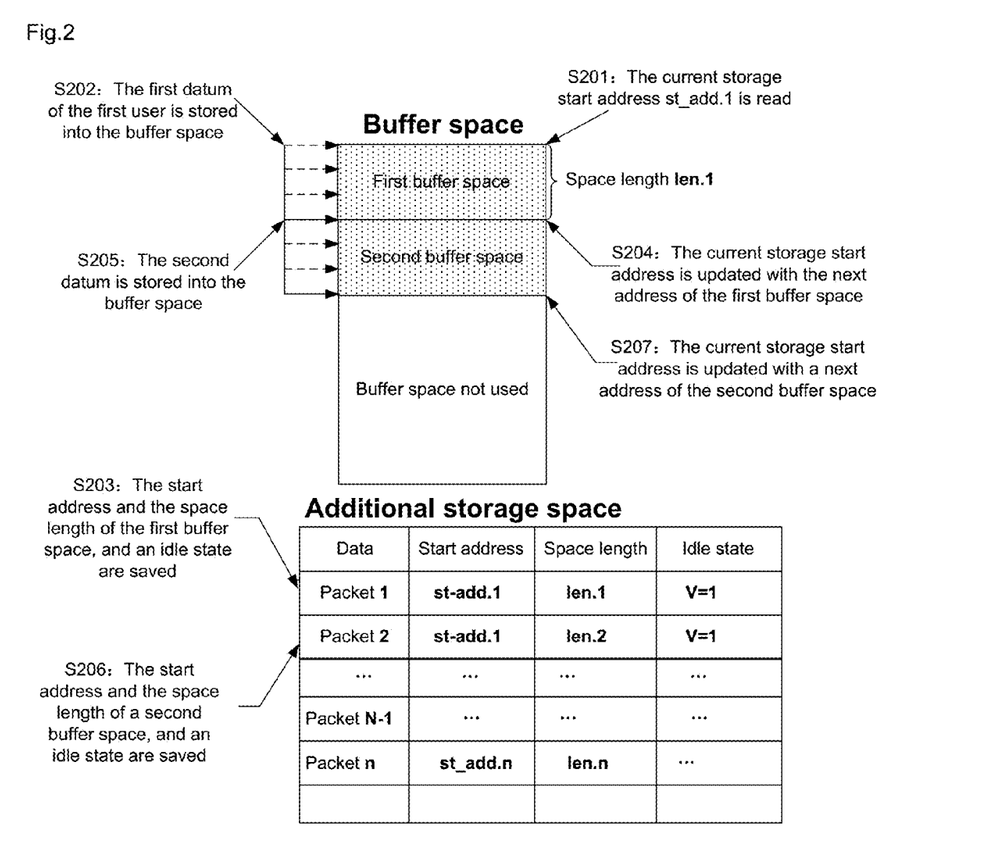
FIG. 2 is a flowchart of a specific method for buffer processing according to embodiment 1 of the disclosure.

As shown in FIG. 2, the following steps are performed when the first datum of the first user needs to be buffered:

Step S201: the current storage start address st_add.1 is read;

Step S202: the first datum of the first user is stored into the buffer space from the current storage start address st_add.1; the buffer space occupied by the first datum is the first buffer space;

Step S203: the start address (e.g., "st_add.1" shown in FIG. 2) and the space length (e.g., "len.1" shown in FIG. 2) of the first buffer space, and an idle state (e.g., "V" shown in FIG. 2, V=1 indicates the data is not released, and V=0 indicates that the data is released) of the first datum are saved in an additional storage space, so that when the first datum needs to be read, the first buffer space can be located to read the first datum as long as the start address st_add.1 and the space length len.1 of the first buffer space are found;

whether the first datum is released is determined according to the idle state of the first datum;

for enabling each stored datum to consecutively occupy the buffer space, after Step S203 is completed, Step 204 is performed, that is, the current storage start address is updated with the next address of the first buffer space;

at this time, the storage start address should be st_add.2; when it is needed to continue storing data, for example, a second datum, the following steps may be performed:

Step S205: the second datum is stored into the buffer space from the st_add.2, and the buffer space occupied by the second datum is a second buffer space (shown in FIG. 2);

note that, the second datum is not necessarily the datum of the first user needing to be buffered, which may belong to other users;

Step S206: the start address (e.g., "st_add.2" shown in FIG. 2) and the space length (e.g., "len.2" shown in FIG. 2) of the second buffer space, and an idle state (e.g., "V" shown in FIG. 2) of the second datum are saved in the additional storage space; and Step S207: the current storage start address is updated with a next address of the second buffer space.

After that, other data needing to be stored should be stored into the buffer space according to the above method, so that each buffered datum can consecutively occupy the buffer space, and the start address of each datum and the space length are recorded in the additional storage space.

Because of the limited buffer space, when a certain datum is stored, a remaining buffer space behind the storage start address may be not enough for subsequent storage, while some buffered data have been read and released, and the buffer space which was used for storing those data has been cleared up, then it is needed to arrange the whole buffer space, namely integrating the buffer space which has been cleared up into the remaining buffer space behind the current storage start address; the method includes that:

a threshold value is set, wherein the threshold value is a buffer space size which may be needed for storing a maximum datum;

if a remaining buffer space behind the current storage start address is smaller than the preset threshold value, data in the buffer space are arranged by a predetermined method, and the start address of each datum is updated after the arrangement; wherein the predetermined method is selecting an invalid datum stored at the earliest from the buffer space, and consecutively storing, at the start address of the selected invalid datum, valid data behind the selected invalid datum until all the valid data consecutively occupy the buffer space; wherein the invalid datum is the released datum; the valid data is the data not released.

The predetermined method is elaborated below.

Figure 3:
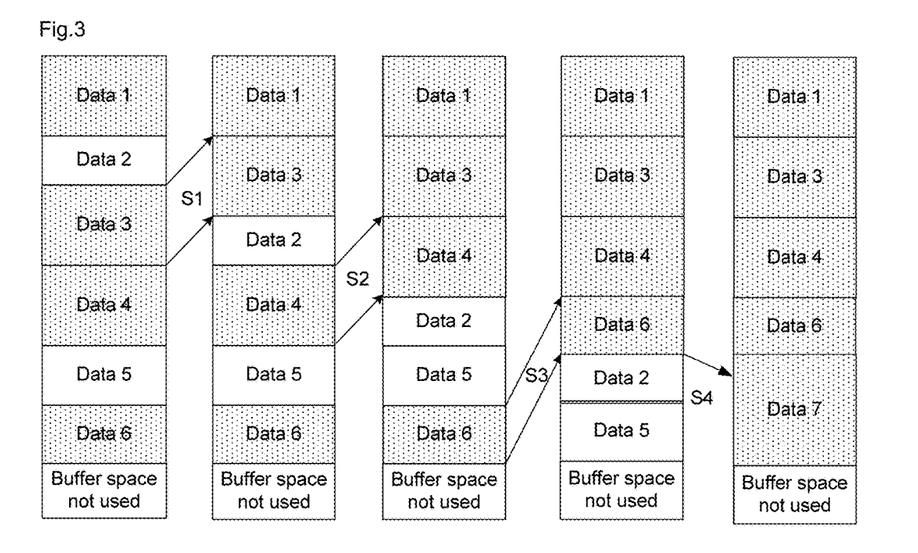
FIG.3 is a flowchart of arranging a buffer space in the method for buffer processing according to embodiment 1 of the disclosure.

As shown in Fig. 3, 6 data have been stored in the buffer space, it can be known from the idle state recorded in the additional storage space that the data 2 and 5 are invalid data (namely the idle state V=0), which have been released, and the buffer spaces where they are also cleared up; the data 1, 3, 4 and 6 are valid data (namely the idle state V=1), and they are not released in the buffer space.

When an instruction is received to store the datum 7, a threshold value is preset, wherein the threshold value is a space size needed for storing a maximum datum; if the remaining buffer space is smaller than the preset threshold value, then it is indicated that the buffer space not used currently cannot store the data 7, and it is needed to arrange the buffer space, which includes the following steps:

Step S1: the current storage start address is updated with the start address of the data 2; the datum 3 is stored from the start address of the datum 2 (namely moving up the buffer space corresponding to the datum 3 for a distance, wherein the distance is equal to the space length of the datum 2), and the start address of the datum 2 recorded in the additional storage space is updated;

Step S2: the current storage start address is updated with the next address of the buffer space where the datum 3 is; the datum 4 is stored at the storage start address, and the start address of the datum 4 in the additional storage space is updated;

Step S3: the current storage start address is updated with the next address of the buffer space where the datum 4 is; the datum 6 is stored at the storage start address, so that the buffer space corresponding to the data 2 and 5 is integrated into the remaining buffer space behind the current storage start address; and then the start address of the datum 6 in the additional storage space is updated; and Step S4: after arrangement of the buffer space is completed, the datum 7 is stored. Note that, all the valid data should consecutively occupy the buffer space.

In addition, when target data need to be read, the target data being arranged may be read mistakenly due to the change of its location in the buffer space. For solving such a problem, a valid datum which is being read or arranged may be locked, so that the valid datum cannot be read and arranged simultaneously in the locking process. For example, when the datum 3 is being arranged, it can be locked, and it will not unlocked until arrangement is completed; when the datum 3 is being locked, a reading request cannot be received, thereby preventing an arrangement process from disturbing a reading process.

The method of the present embodiment has the following beneficial effects:

1. consecutively storing data into the buffer space can make better use of the buffer space, thereby saving resources;

2. arranging the buffer space, integrating the buffer space which has been cleared up into the remaining buffer space behind the current storage start address, keeping that all the valid data have consecutively occupied the buffer space and that more data can be stored in a limited buffer space, thereby further saving resources; and 3. in the prior art, the whole buffer space is divided into a number of fragments, some big data are saved by many fragments, and it is needed to record buffer addresses of these fragments for reading data, so the amount of stored information is very large, while in the present embodiment, the buffer space consecutively stores the data, so reading can be implemented by only recoding the start address of each valid datum in the buffer space and the space length.

Embodiment 2

Figure 4:
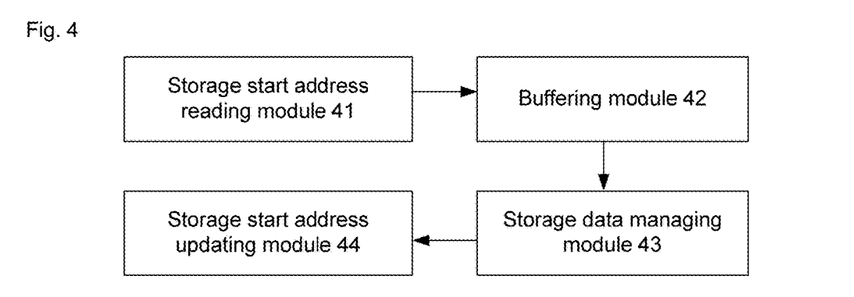
FIG. 4 is a diagram of a device for buffer processing according to embodiment 2 of the disclosure.

As shown in FIG. 4, a device for buffer processing includes:

a storage start address reading module 41, which is configured to read the current storage start address when the first datum of the first user needs to be buffered;

a buffering module 42, which is configured to store the first datum into the buffer space from the current storage start address, wherein the buffer space occupied by the first datum is the first buffer space;

a storage data managing module 43, which is configured to, corresponding to the first datum of the first user, save the storage location information including the start address and the space length of the first buffer space, so that when the first datum needs to be read, the first buffer space can be located according to the start address and the space length, and the first datum can be read from the first buffer space; and a storage start address updating module 44, which is configured to update the current storage start address with the next address of the first buffer space, so that a next datum needing to be buffered can be buffered from the storage start address, thus each buffered datum can consecutively occupy the buffer space.

In addition, the storage data managing module 43 can also record the idle state of the first datum, and determine whether the first datum is released according to the idle state.

Because of the limited buffer space, when a certain datum is stored, the remaining buffer space behind the storage start address may be not enough for subsequent storage, while some buffered data have been read and released, and the buffer space corresponding to them has been cleared up, then it is needed to arrange the whole buffer space.

Thus, the device may further include an arrangement module; wherein, the arrangement module will set a threshold value, and the threshold value is a buffer space size which may be needed for storing a maximum datum; if the remaining buffer space behind the current storage start address is smaller than the preset threshold value, the data in the buffer space are arranged by the predetermined method, and the start address of each datum is updated after the arrangement; wherein the predetermined method is selecting an invalid datum stored at the earliest from the buffer space, and consecutively storing, at the start address of the selected invalid datum, the valid data after the datum stored at the earliest until all the valid data consecutively occupy the buffer space; wherein the invalid datum is the released datum, and the valid data is the data not released. After the arrangement is completed, the storage start address updating module 44 updates the current storage start address with the next address of the last valid datum in the buffer space.

The predetermined method is specifically selecting an invalid datum stored at the earliest from the buffer space, obtaining, through the storage location information of the selected invalid datum, the start address of the selected invalid datum in the buffer space, and updating the current storage start address with the start address of the selected invalid datum; storing the first valid datum behind the invalid datum from the storage start address, and updating the storage location information of the first valid datum; and updating the current storage start address with the next address of the first valid datum in the buffer space, so that the next valid data behind the first valid datum can be buffered again from the storage start address, until each buffered valid datum can consecutively occupy the buffer space.

For preventing the arrangement module from disturbing reading of the data in the buffer space in the arrangement process, the device may further include a locking module; the locking module can lock a valid datum which is being read or arranged, so that the valid datum cannot be read and arranged simultaneously in the locking process.

In a practical application, the storage start address reading module, the buffering module, the storage data managing module, the storage start address updating module, the arrangement module and the locking module can be implemented by a CPU, a DSP or a Field-Programmable Gate Array (FPGA) in the device for buffer processing.

The method of the present embodiment has the following beneficial effects:

1. consecutively storing the data into the buffer space can make better use of the buffer space, thereby saving resources;

2. arranging the buffer space, integrating the buffer space which has been cleared up into the remaining buffer space behind the current storage start address and keeping that all the valid data have consecutively occupied the buffer space and more data can be stored in a limited buffer space, thereby further saving resources; and 3. in the prior art, the whole buffer space is divided into a number of fragments, some big data are saved by many fragments, and it is needed to record buffer addresses of these fragments for reading data, so the amount of stored information is very large, but in the present embodiment, the buffer space consecutively stores the data, so reading can be implemented by only recoding the start address of each valid datum in the buffer space and the space length.

The above are only the preferred embodiments of the disclosure. It should be noted that, without departing from the principles of the disclosure, the common skilled in the art may also make a number of improvements and supplements, and these improvements and supplements shall fall within the scope of the claims of the disclosure.

What is claimed is:

1. A method for buffer processing in a System on Chip, SOC, comprising:
    when a first datum of a first user needs to be buffered, reading a current storage start address of a buffer space, which is shared by sub-systems in the SOC;
    storing the first datum into the buffer space from the current storage start address, wherein the buffer space occupied by the first datum is a first buffer space;
    for the first datum, saving storage location information comprising a start address and a space length of the first buffer space, to locate the first buffer space according to the start address and the space length of the first buffer space when the first datum needs to be read, and reading the first datum from the first buffer space; and
    updating the current storage start address with a next address of the first buffer space, to buffer next data needing to be buffered from the updated current storage start address;
    wherein after storing the first datum into the buffer space from the current storage start address, recording an idle state of the first datum, and determining whether the first datum is released according to the idle state;
    setting a threshold value, wherein the threshold value is a buffer space size needed for storing a maximum datum;
    when a remaining buffer space behind the current storage start address is smaller than the threshold value, arranging data in the buffer space by a predefined method, and updating a start address of each datum after the arrangement; wherein the predefined method is selecting from the buffer space an invalid datum stored at the earliest, and consecutively storing, from a start address of the selected invalid datum, valid data behind the selected invalid datum until all the valid data consecutively occupy the buffer space; wherein the invalid datum is a released datum, and the valid data are data not released; and
    after the arrangement is completed, updating the current storage start address with a next address of a last valid datum in the buffer space.

2. The method according to claim 1, wherein the predefined method is:
    selecting the invalid datum stored at the earliest from the buffer space, obtaining, through storage location information of the selected invalid datum, the start address of the selected invalid datum in the buffer space, and updating the current storage start address with the start address of the selected invalid datum;
    storing a first valid datum behind the selected invalid datum from the updated current storage start address, and updating storage location information of the first valid datum; and
    updating the current storage start address with a next address of the first valid datum in the buffer space, to buffer a next valid datum behind the first valid datum from the updated current storage start address until each buffered valid datum is capable of consecutively occupying the buffer space.

3. The method according to claim 1, further comprising:
locking a valid datum which is being read or arranged to ensure the valid datum not to be read and arranged simultaneously in the locking process.

4. The method according to claim 1, further comprising:
locking a valid datum which is being read or arranged to ensure the valid datum not to be read and arranged simultaneously in the locking process.

5. The method according to claim 1, further comprising:
locking a valid datum which is being read or arranged to ensure the valid datum not to be read and arranged simultaneously in the locking process.

6. The method according to claim 2, further comprising:
locking a valid datum which is being read or arranged to ensure the valid datum not to be read and arranged simultaneously in the locking process.

7. A device for buffer processing in a System on Chip, SOC, comprising a processor configured to be capable of executing programmed instructions comprising:

reading a current storage start address of a buffer space when a first datum of a first user needs to be buffered, wherein the buffer space is shared by sub-systems in the SOC;

storing the first datum into the buffer space from the current storage start address, wherein the buffer space occupied by the first datum is a first buffer space;

for the first datum, saving storage location information comprising a start address and a space length of the first buffer space, to locate the first buffer space according to the start address and the space length of the first buffer space when the first datum needs to be read and reading the first datum from the first buffer space; and updating the current storage start address with a next address of the first buffer space, to buffer next data needing to be buffered from the updated current storage start address;

wherein after storing the first datum into the buffer space from the current storage start address, recording an idle state of the first datum, and determine whether the first datum is released according to the idle state;

setting a threshold value, wherein the threshold value is a buffer space size needed for storing a maximum datum;

when a remaining buffer space behind the current storage start address is smaller than the threshold value, arranging data in the buffer space by a predefined method, and updating a start address of each datum after the arrangement; wherein the predefined method is selecting from the buffer space an invalid datum stored at the earliest, and consecutively storing, from a start address of the selected invalid datum, valid data behind the selected invalid datum until all the valid data consecutively occupy the buffer space; wherein the invalid datum is a released datum, and the valid data are data not released; and after the arrangement is completed, updating the current storage start address with a next address of a last valid datum in the buffer space.

8. The device according to claim 7, the processor configured to be capable of executing programmed instructions further comprising:
locking a valid datum which is being read or arranged to ensure the valid datum not to be read and arranged simultaneously in the locking process.

9. The device according to claim 7, the processor configured to be capable of executing programmed instructions further comprising:
locking a valid datum which is being read or arranged to ensure the valid datum not to be read and arranged simultaneously in the locking process.

10. The device according to claim 7, the processor configured to be capable of executing programmed instructions further comprising:
locking a valid datum which is being read or arranged to ensure the valid datum not to be read and arranged simultaneously in the locking process.

* * * * *

UNITED STATES PATENT AND TRADEMARK OFFICE
CERTIFICATE OF CORRECTION

PATENT NO. : 9,563,584 B2
APPLICATION NO. : 14/442066
DATED : February 7, 2017
INVENTOR(S) : Linsheng Zhang

Page 1 of 1

It is certified that error appears in the above-identified patent and that said Letters Patent is hereby corrected as shown below:

On the Title Page (73) Assignees should read: ZTE CORPORATION, Shenzhen, Guangdong (CN); ZTE MICROELECTRONICS TECHNOLOGY CO., LTD., Shenzhen, Guangdong (CN)

Signed and Sealed this
Ninth Day of January, 2018

Joseph Matal
*Performing the Functions and Duties of the*
*Under Secretary of Commerce for Intellectual Property and*
*Director of the United States Patent and Trademark Office*